United States Patent
Yang et al.

(10) Patent No.: US 9,449,821 B2
(45) Date of Patent: Sep. 20, 2016

(54) COMPOSITE HARD MASK ETCHING PROFILE FOR PREVENTING PATTERN COLLAPSE IN HIGH-ASPECT-RATIO TRENCHES

(71) Applicant: Macronix International Co., Ltd., Hsinchu (TW)

(72) Inventors: Zusing Yang, Hsinchu (TW); An Chyi Wei, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/333,802

(22) Filed: Jul. 17, 2014

(65) Prior Publication Data
US 2016/0020211 A1    Jan. 21, 2016

(51) Int. Cl.
| H01L 21/302 | (2006.01) |
| H01L 21/3065 | (2006.01) |
| H01L 21/308 | (2006.01) |
| H01L 21/311 | (2006.01) |
| H01L 21/3205 | (2006.01) |
| H01L 21/027 | (2006.01) |
| H01L 21/02 | (2006.01) |
| H01L 21/3213 | (2006.01) |
| H01L 27/115 | (2006.01) |

(52) U.S. Cl.
CPC ....... *H01L 21/0276* (2013.01); *H01L 21/0217* (2013.01); *H01L 21/31111* (2013.01); *H01L 21/31116* (2013.01); *H01L 21/32133* (2013.01); *H01L 27/11551* (2013.01); *H01L 27/11578* (2013.01)

(58) Field of Classification Search
CPC .................... H01L 21/28282; H01L 27/11568
USPC ......... 257/324, 329, 331, E21.309; 438/257, 438/261, 264, 242
See application file for complete search history.

(56) References Cited

U.S. PATENT DOCUMENTS

| 7,122,455 B1 * | 10/2006 | Lyons ................. H01L 21/0337 257/E21.023 |
| 2004/0018738 A1 * | 1/2004 | Liu ...................... H01L 21/0337 438/700 |
| 2008/0153298 A1 * | 6/2008 | Hui .................... H01L 21/31116 438/703 |
| 2011/0201206 A1 * | 8/2011 | Ishikawa ............... C23C 16/347 438/703 |
| 2013/0059450 A1 * | 3/2013 | Le Gouil ............ H01L 21/3065 438/715 |
| 2014/0264897 A1 * | 9/2014 | Chiu ................. H01L 21/28282 257/773 |
| 2014/0295636 A1 * | 10/2014 | Makala ............. H01L 29/66833 438/287 |

* cited by examiner

*Primary Examiner* — Kimberly Rizkallah
*Assistant Examiner* — Brian Turner
(74) *Attorney, Agent, or Firm* — Fish & Richardson P.C.

(57) ABSTRACT

High-aspect ratio trenches in integrated circuits are fabricated of composite materials and with trench boundaries having pencil-like etching profiles. The fabrication methods reduce surface tension between trench boundaries and fluids applied during manufacture, thereby avoiding pattern bending, bowing, and collapse. The method, further, facilitates fill-in of trenches with suitable selected materials.

16 Claims, 4 Drawing Sheets

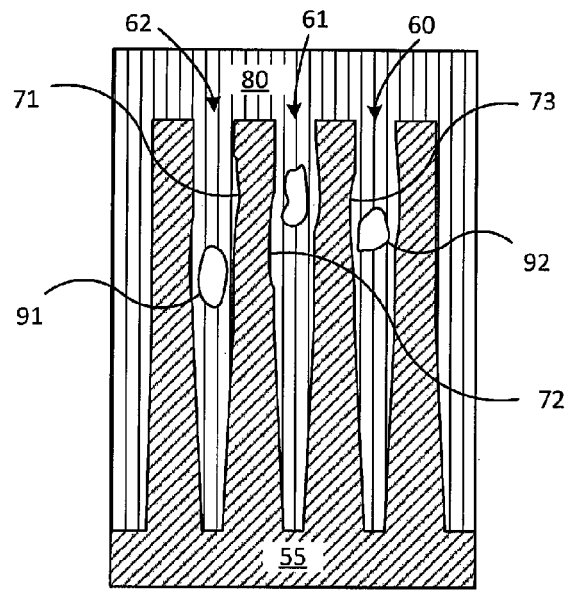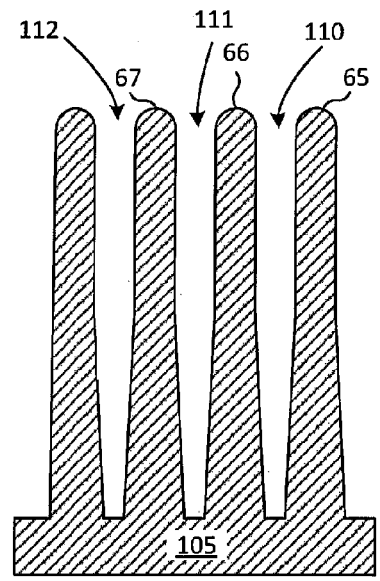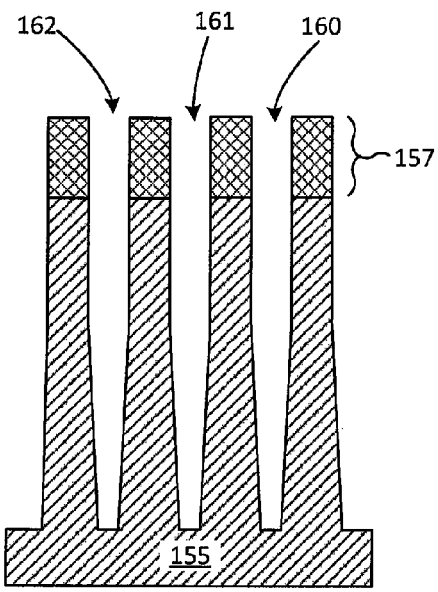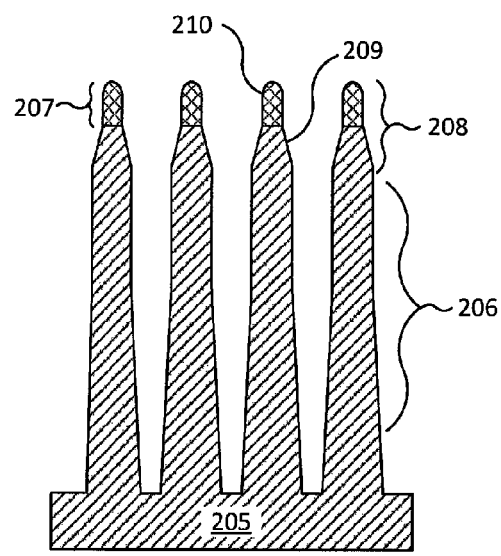
FIG. 5 (Prior Art)
FIG. 6
FIG. 7
FIG. 8

COMPOSITE HARD MASK ETCHING PROFILE FOR PREVENTING PATTERN COLLAPSE IN HIGH-ASPECT-RATIO TRENCHES

BACKGROUND OF THE INVENTION

1. Field of the Invention

The present invention relates generally to semiconductor fabrication methods and, more particularly, to etching techniques for forming high-aspect-ratio trench structures.

2. Description of Related Art

As integrated circuit device sizes become smaller with critical dimensions less than 50 nm, fabrication of arrays of high-aspect-ratio trenches using wet strip processes can result in distortion, e.g., bending, of trench boundaries, even to the point, not so uncommonly, of collapse. Post-etch investigation has confirmed that such bending typically does not occur prior to, bur rather occurs at the time of, wet-strip processing during prior art manufacturing. This observation tends to confirm that the bending is caused by capillary forces on trench side walls that occur during the wet strip processing. Eliminating wet strips from the fabrication process, however, is not a viable or attractive solution to the bending/collapse problem, as wet strips provide a powerful tool, e.g., for removal of polymer residue.

High-aspect-ratio trenches also may be prone to bowing, producing a profile that can create problems when trenches are filled-in with material. Polysilicon is a material widely used to fill in such trenches. The bowing may lead to formation, e.g., of voids in the fill-in, which naturally can materially and adversely effect the operation of a given integrated circuit, thereby reducing yields and increasing manufacturing cost.

A need thus exists in the prior art for a method of fabricating collapse-free trenches. A further need exists for avoiding bowing in the formation of trench profiles.

SUMMARY OF THE INVENTION

The present invention addresses these needs by providing a manufacturing method that avoids collapse of high-aspect-ratio trenches by forming a pencil-like bit line (BL) profile that separates and facilitates fill-in of the trenches.

An implementation of the method can comprise providing a semiconductor film stack having a hard mask (HM) layer disposed above a plurality of alternating oxide/polysilicon (OP) layers, a silicon nitride (SIN) layer, and one or more dielectric layers.

An OP etch, for example, employing etchants such as $NF_3/CH_2F_2/N_2$, may be performed to form a plurality of high-aspect-ratio trenches in the OP layers, followed by trimming the HM layer to expose portions of the SIN layer. A critical dimension (CD) trim operation is performed whereby exposed portions of the SIN layer are etched by plasma. One or more strip operations may be performed to remove HM material, thereby forming a pencil-like bit line (BL) profile in the OP layers such that collapse of the high-aspect-ratio trenches is inhibited or avoided, for example, substantially avoided, and fill in of the high-aspect ratio trenches is facilitated.

According to one implementation of the invention, the performing of an OP etch preferentially removes material in a dielectric layer, the dielectric layer underlying the SIN layer, and the OP etch undercutting the SIN layer. A particular implementation of the invention comprises forming an upper oxide layer under the SIN layer, the CD trim operation being used to form a taper in the upper oxide layer and a tapered and/or rounded shape in the SIN layer.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE DRAWINGS

FIG. 5 is an illustration of prior art high-aspect-ratio trenches exhibiting bowing with resulting voids occurring during fill-in;

FIG. 6 illustrates high-aspect-ratio semiconductor trenches having rounded trench boundaries;

FIG. 7 portrays fabrication of trench boundaries using composite material;

FIG. 8 describes the cross-section of a plurality of high-aspect-ratio trenches fabricated according to the present invention;

DETAILED DESCRIPTION OF THE INVENTION

Figure 1:
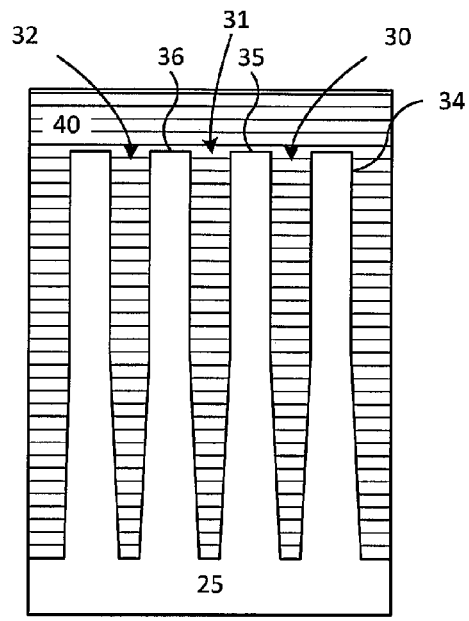
FIG. 1 is a cross-sectional diagram of a plurality of prior art high-aspect-ratio semiconductor trenches immersed in fluid.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to fabrication of high-aspect-ratio trenches and a related method of manufacture.

Referring more particularly to the drawings, FIG. 1 illustrates a prior art semiconductor structure 20 comprising a plurality of high-aspect-ratio (e.g., depth-to-width ratio exceeding about 10) trenches having a critical dimension (CD) less than about 50 nm and formed in material 25 that may comprise semiconducting material such as silicon, dielectric material such as an oxide, e.g., silicon oxide, conducting material such as metal, polysilicon and the like. For simplicity the material 25 as well as corresponding material in FIGS. 2-8 is referred to herein as integrated circuit material. The structure 20 is immersed in fluid 40 as might occur, for example, during a wet strip manufacturing process. Representative trenches 30/31/32 are shown in FIG. 1 separated by representative trench boundaries 34/35/36.

Figure 2:
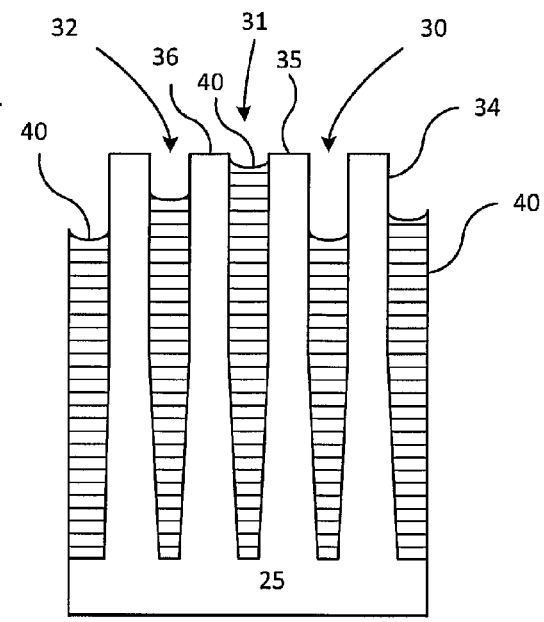
FIG. 2 illustrates partial evaporation of fluid in the prior art trenches of FIG. 1.
Figure 3:
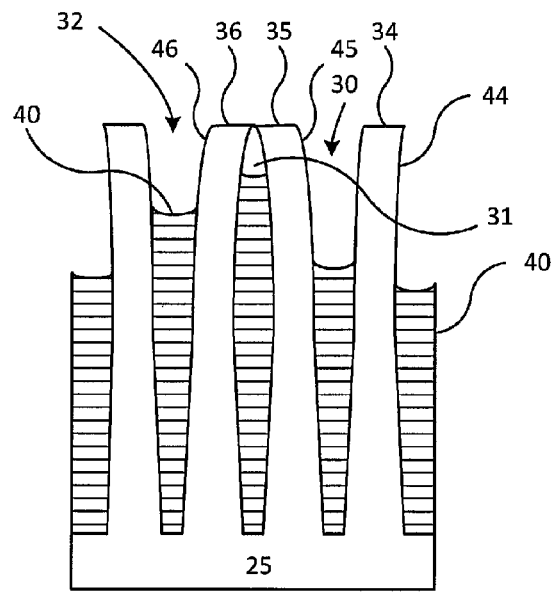
FIG. 3 describes bending of trench boundaries resulting from capillary forces on sides of the prior art trenches of FIGS. 1 and 2.
Figure 4:
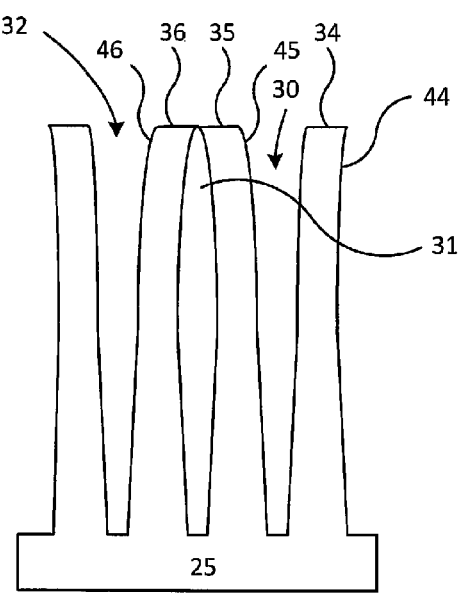
FIG. 4 shows an example of trench collapse in the prior art high-aspect-ratio trench structure of FIG. 1.

FIG. 2 shows a result of partial evaporation of the fluid 40 and illustrates a tendency of the surface of the fluid to cling to the material of the trench boundary in areas of contact. This well-understood tendency is known to result from surface tension between the fluid 40 and the integrated circuit material 25. This surface tension may apply a force (i.e., capillary forces) to sides of the trenches (i.e., trench boundaries) that may, given the extremely narrow width of the trench boundaries, cause bending of trench boundaries as illustrated in FIG. 3. Trench boundary 34 exhibits a bend 44 away from trench boundary 35, the latter trench boundary 35 bending toward trench boundary 36 in the example shown in FIG. 3. At the same time, trench boundaries 35 and 36 bend toward each other to an extent that trench 31 is occluded, trench boundary 36 having a bend 46 that complements a bend 45 in trench boundary 35 to create the occlusion. When the fluid is fully evaporated, the trench structure 20 may appear as illustrated in FIG. 4, wherein trench 31 is fully collapsed, a situation which, when occurring in a memory chip, for example, may represent destruction of one or more memory cells.

The effects of surface tension and/or capillary forces also may cause bowing in trench boundaries, examples of which are illustrated in FIG. 5, during, for example, a wet strip operation. A prior art structure 50 shown in FIG. 5 formed of integrated circuit material 55 and comprising high-aspect-ratio trenches 60/61/62 illustrates examples of bowing 71, 72 and 73 on sides of the trenches. When the trenches 60/61/62 are filled-in with polysilicon the bowing may cause formation of interstices, examples which are voids 91 and 92, in the polysilicon, which voids cause damage to the polysilicon line, and as a result the performance of the integrated circuit is detrimentally affected.

An implementation of a method of the present invention may mitigate the effects of the surface tension by introducing a top rounding effect on trench boundaries as described in FIG. 6, which is a diagram representing a high-aspect-ratio trench structure 100 formed of integrated circuit material 105 having trenches 110/111/112 formed therein. Boundaries between the trenches are formed with rounded tops (e.g., rounded tops 65/66/67. According to another implementation, effects of surface tension and/or capillary forces may be reduced by using composite materials to form the trench boundaries. For example, the structure 150 illustrated in FIG. 7 is fabricated of a lower region 155 of integrated circuit material topped off by an upper region 157 formed of a different material.

The structure 200 shown in FIG. 8 combines the concepts associated introduced in FIGS. 6 and 7 to create a structure fabricated with a lower region 206 of integrated circuit material 205 and an upper region 207 formed of a different material 210. Further, the upper portion 208 of trench boundaries exhibits a taper 209, suggesting a pencil-like profile that is more fully described below.

Figure 9:
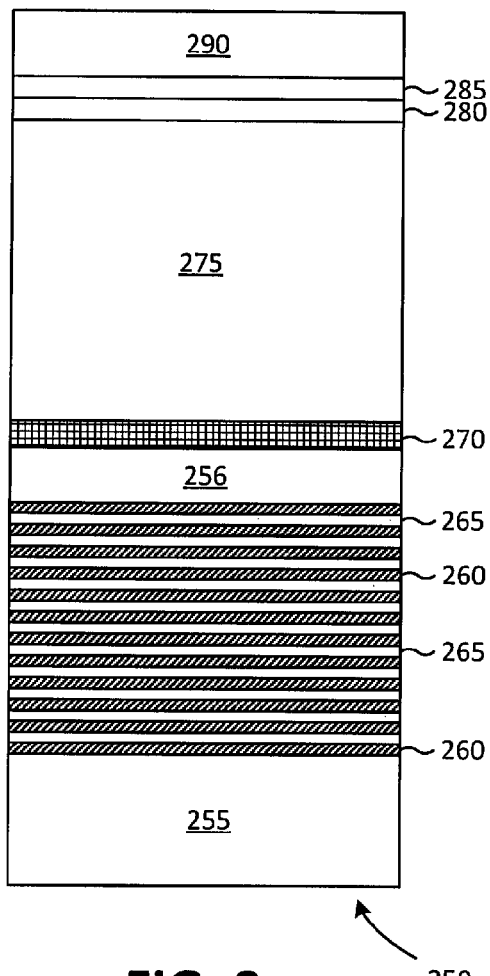
FIG. 9 is a diagram of a semiconductor stack into which high-aspect-ratio trenches may be formed.
Figure 13:
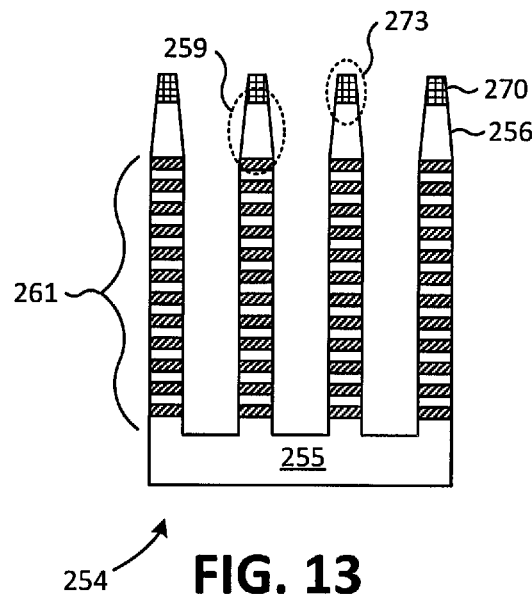
FIG. 13 presents trenches having a pencil-like bit line (BL) profile according to the present invention.

Fabrication of a bit line (BL) structure 254 having a pencil-like profile such as that shown in FIG. 13 may begin with the providing, e.g., forming, of a semiconductor stack 250, one example of which is described in FIG. 9. The semiconductor stack 250 may be formed on a substrate (not shown) and may comprise a first oxide layer 255 having a thickness ranging from 0 to about 2 µm, with a typical thickness being, for instance, about 1000 Å to about 5000 Å. A collection of alternating layers of conducting material (e.g., polysilicon 260) and dielectric material (e.g., oxide 265) may be formed using techniques such as, for example, the thin-film or diffusion related manufacturing process, to overlay the first oxide layer 255, each polysilicon layer 260 and oxide layer 265 having a thickness ranging from about 150 Å to about 1000 Å, with typical values being, for instance, about 200 Å in the example in the figure. The number of alternating oxide/polysilicon (OP) layers 260/265 may range from about 2 pairs to about 64 pairs with twelve polysilicon layers 260 being shown in FIG. 9.

A second oxide layer 256 having a thickness in a range of about 200 Å to about 2000 Å, with a typical value being, for instance, about 1300 Å, is formed, e.g., using a technique such as the thin-film related manufacturing process, over the OP layers 260/265, and a layer of silicon nitride (SIN) 270 having a thickness in a range of about 200 Å to about 2000 Å, with a typical value being, for instance, about 600 Å, may be formed using a technique such as the thin-film related manufacturing process to overlay the second oxide layer 256.

A layer of amorphous carbon, that may be referred to herein as a hard mask amorphous carbon layer (ACL) 275, having a thickness in a range of about 2000 Å to about 100000 Å, with a typical value being, for instance, about 4 µm, is deposited, using a technique such as the thin-film related manufacturing process on the SIN layer 270. The ACL 275 is overlaid using known means by a layer of dielectric antireflective coating (DARC®) 280, e.g., about or on the order of 380 nm thick, which has formed using known means thereon a bottom antireflective coating (BARC) layer 285, e.g., about or on the order of 320 nm thick. A photoresist layer 290, e.g., about or on the order of 1 µm thick, is deposited using a conventional protocol on the BARC layer 285, the photoresist being patterned according to a layout of trenches to be formed in the semiconductor stack 250.

Figure 10:
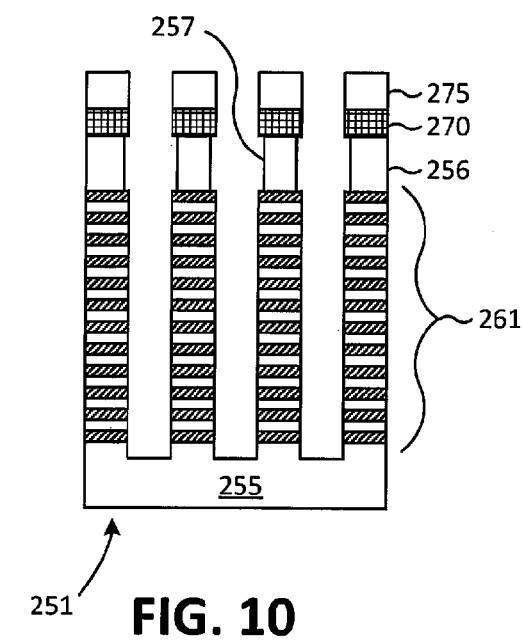
FIG. 10 shows the semiconductor stack of FIG. 9 with high-aspect-ratio trenches partially formed therein.

The semiconductor stack 250 may be subjected to an etch of the OP layers 260/265 (i.e., an OP etch) using, for instance, a plasma of etchant(s), such as, e.g., $NF_3/CH_2F_2/N_2$, to form initial trenches having trench boundaries with cross-sections as shown in the structure 251 of FIG. 10. Widths of the trenches (i.e., of the cross-sections) may be in a range of about 10 nm to about 100 nm, with a typical value being, for instance, about 20 nm in the example in the figure. Each trench boundary in the example of FIG. 10 comprises OP layers 261 topped by a stack comprising the second oxide layer 256, the SIN layer 270 and a remaining portion of the ACL 275.

The plasma used to perform the etch may create an undercut 257 in the second oxide layer 256 as illustrated. As can be seen, the width of each trench (i.e., of the cross-section) in the undercut 257 region of each trench is greater than other parts of the trench, typically ranging from about 10 nm to about 40 nm, with a typical width being, for instance, about 25 nm in the example in the figure.

Figure 11:
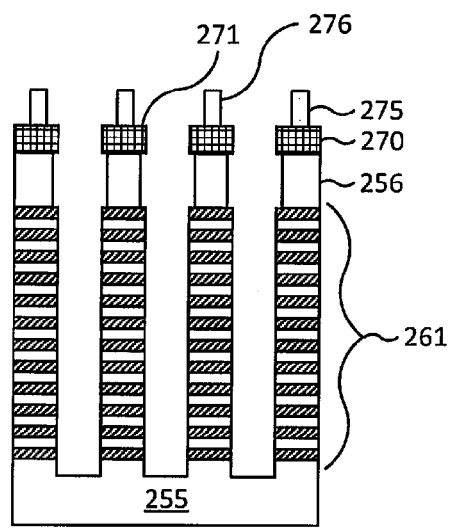
FIG. 11 describes a result of a trimming of a hard mask performed on the structure of FIG. 10 showing.

An etch step, e.g., employing etchant(s) such as $CF_4/O_2$, e.g., at a substantially zero bias power, may be used to trim the hard mask ACL 275 (FIG. 10) to a reduced, e.g., relatively narrow, hard-mask ACL structure 276 as described by FIG. 11 in the structure 252. This trim step (i.e., a hard-mask trim) may increase the width of each trench (i.e., of the cross-section) in the ACL 275 region of each trench to a width, typically ranging from about 20 nm to about 100 nm, with a typical width being, for instance, about 30 nm in the example in the figure. On the other hand, a thickness of each hard-mask ACL structure 276 following the hard-mask trim may be from about 500 Å to about 2000 Å, with a typical thickness, for instance, being about 800 Å in the example in the figure.

The hard-mask trim serves to expose (i.e., make naked) portions 271 of the SIN layer 270.

Figure 12:
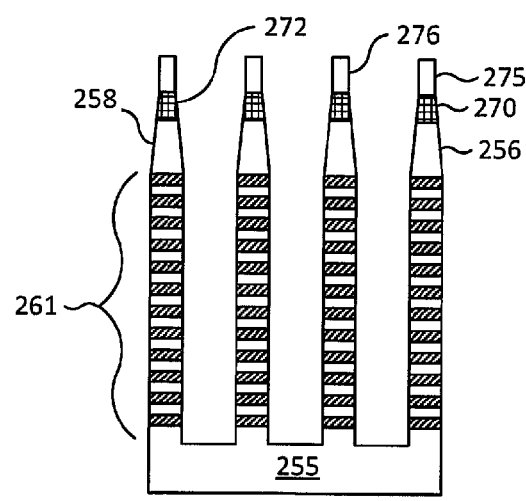
FIG. 12 is an illustration of a further trimming operation performed on the structure of FIG. 11, whereby a taper is formed on top boundaries between trenches.

An ensuing CD trim step can be implemented to yield a structure 253 as shown FIG. 12; the CD trim step can employ, e.g., a plasma of etchant(s) such as $C_4F_8/O_2/Ar$, e.g., at a relatively high bias power to enable etching of the portions 271. The bias power level may range from about 0 to about 600 watts, with a typical bias power level being about 350 watts.

The CD trim may adjust widths of each trench according to the remaining portion of the hard mask ACL 275 (i.e., according to each hard-mask ACL structure 276).

Widths of each trench at an upper (e.g., top) region of the second oxide layer 256 may be increased to for example values in a range of about 10 nm to about 40 nm, with a typical width being, for instance, about 25 nm in the example in the figure. On the other hand, widths of each trench at an upper (e.g., top) region of the SIN layer 270 may be increased for example to values in a range of about 10 nm to about 30 nm, with a typical width being, for instance, about 15 nm in the example in the figure.

The CD trim may also, e.g., simultaneously with the width adjusting, form tapers in each trench in regions of the second oxide layer 256 and/or the SIN layer 270 according to the hard-mask ACL structures 276). A taper angle with respect to vertical (i.e., a longitudinal axis of each trench), may be in a range of about 70° to about 89.9° with a typical taper angle being, for instance, about 85° in the example in the figure.

FIG. 13 illustrates a trench structure 254, wherein trench boundaries exhibit a pencil-like profile. The structure 254 may be obtained from, for example structure 253 (FIG. 12) by performing dry/wet strips to remove polymer residues and remove the ACL 275. The dry strip may be performed using, for example, oxygen ash, and the wet strip may employ etchants such as sulfuric acid, hydrogen peroxide and the like. In one example, the dry strip removes the ACL and the wet strip removes the polymer/residue.

The resulting structure 254 comprises a main multilayered body 261 of oxide and polysilicon as already described and is at least partially characterized by composite materials formed as a rounded and/or tapered SIN hard mask 273 with a tapered oxide hard mask 259. These features of the structure 254 may have an effect of reducing surface tension between trench boundaries and liquids applied during the wet strip process, thereby creating a collapse-free pattern of trenches. The pencil-like cross-section of the structure 254, further, is adapted for easy fill-in of, e.g., polysilicon.

Structure 261 may have a height in a range of about 2000 Å to 10000 Å, for example about 5000 Å in the figure, a width in a range of about 10 nm to 100 nm, for example, about 30 nm as shown in the figure, and an angle in a range of about 80° to about 89.9°, for example, about 89.2° as shown in the figure, respectively.

Structure 256 may have a height in a range of about 200 Å to about 2000 Å, for example about 1300 Å as shown in the figure, a width in a range of about 10 nm to about 40 nm, for example, about 25 nm as shown in the figure, and an angle in a range of about 80° to about 89.9°, for example, about 85° as shown in the figure, respectively.

Structure 270 may have a height in the range of about 200 Å to about 2000 Å, for example, about 600 Å as shown in the figure, a width in the range of about 10 nm to about 30 nm, for example, about 15 nm as shown in the figure, and an angle in the range of about 80° to about 89.9°, for example, about 85° as shown in the figure, respectively.

The pencil-like hard mask profile effectively eliminates bending, bowing and collapsing of trenches without requiring a change in conventional wet strip methods. For example, wet strip temperatures and/or solvents that are normally used may continue to be used with the practice of the present invention.

Figure 14:
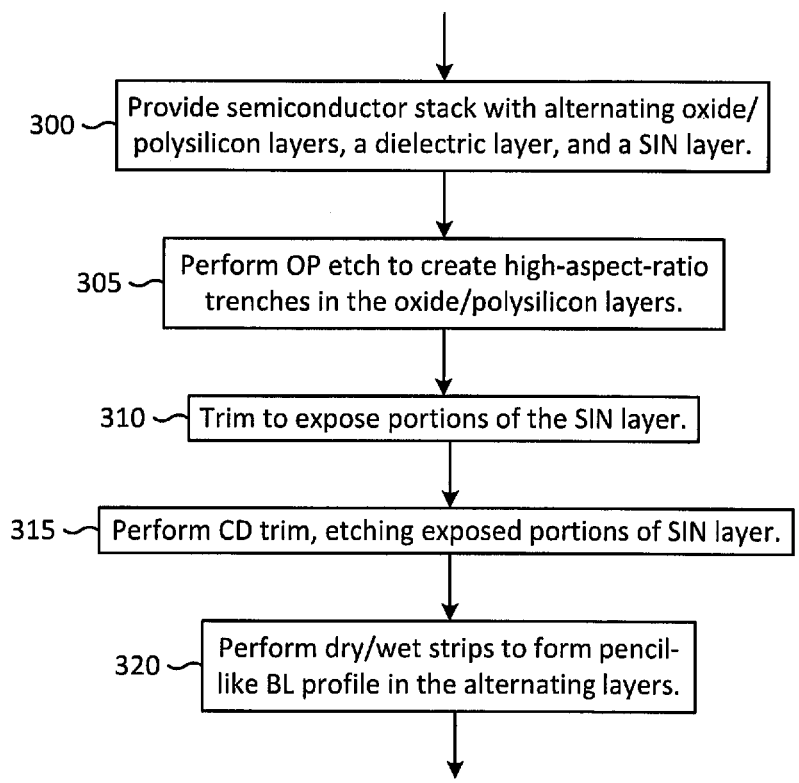
FIG. 14 is a flow chart that describes an implementation of a method of the present invention.

An implementation of a method of the present invention is summarized in the flowchart of FIG. 14. According to the illustrated implementation and with reference to FIG. 9, a semiconductor stack 250 is provided at step 300, the semiconductor stack 250 can include a first oxide layer 255, and is provided to include a plurality of alternating polysilicon layers 260 and oxide layers 265 overlaid by a dielectric layer (e.g., a second oxide layer 256) and a SIN layer 270.

Additional layers already described, including an appropriately-patterned photoresist layer 290 and a hard mask layer formed of, e.g., amorphous carbon, i.e., an ACL 275, may control an OP etch performed at step 305 to form trenches having a high aspect ratio in the OP layers 260/265. The OP etch may thereby transform the semiconductor stack 250 into a structure 251 such as illustrated in FIG. 10. Trenches formed in the structure 251 have trench boundaries that include OP layers 261, the second oxide layer 256, the SIN layer 270 and the ACL 275. The OP etch may create an undercut 257 in the second oxide layer 256 as shown in FIG. 10.

At step 310 a hard mask trim operation, which may use $CF_4/O_2$ as an etchant at substantially zero bias power, may be performed to remove portions of the ACL 275, retaining relatively narrow portions (i.e., hard-mask ACL structures 276) of the ACL 275 and exposing portions 271 of the SIN layer 270 as shown in FIG. 11.

With reference to the next process step 315, as shown in FIG. 14 the implementation continues by adjusting widths of the trenches using a CD trim process employing a plasma of etchants such as $C_4F_8/O_2/Ar$ at high bias power. The CD trim is at least partially controlled by the hard-mask ACL structures 276, resulting in tapered shapes 258 (FIG. 12) for remaining portions of the second oxide layer 256 and introducing a taper 272 (FIG. 12) in the SIN layer 270.

Dry/wet strips performed at step 320 may remove parts or all of each hard-mask ACL structures 276, resulting in pencil-shaped structures as shown in FIG. 13. The pencil-like shapes formed by the trench boundaries each include a main body 261 of multilayered oxide and polysilicon and a remaining portion of the second oxide layer 256 that exhibits a taper 259. A remaining portion of the SIN layer 270 may exhibit a rounded and/or tapered appearance, these tapered forms acting to reduce effects of surface tension during the wet strip process, thereby attenuating or preventing collapse of the high-aspect-ratio trenches and facilitating fill-in at a later step(s) in the manufacturing process. The reduction of surface tension effects may, further, reduce incidences of bending and/or bowing of BL profiles, thereby attenuating or preventing voids such as those of a type described above in relation to the description of FIG. 5 during fill-in.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method, comprising:
    providing a semiconductor film stack having a hard mask layer disposed above oxide/polysilicon (OP) layers, a silicon nitride (SIN) layer, and one or more dielectric layers;
    performing an OP etch that forms a plurality of high-aspect-ratio trenches in the OP layers, wherein performing the OP etch preferentially removes material in at least one dielectric layer of the one or more dielectric layers, the at least one dielectric layer overlaying the SIN layer, and the OP etch generating an undercut in an oxide layer disposed beneath the SIN layer;
    trimming the hard mask layer to expose portions of the SIN layer;
    performing a critical dimension (CD) trim operation, whereby exposed portions of the SIN layer are etched by plasma; and
    performing one or more strip operations to remove hard mask material, thereby forming a pencil-like bit line (BL) profile in the OP layers, whereby collapse of the high-aspect-ratio trenches is avoided and fill-in of the high-aspect-ratio trenches is facilitated.

2. The method as set forth in claim 1, wherein:
    the providing comprises forming an upper oxide layer under the SIN layer; and
    the performing of a CD trim operation forms a taper in the upper oxide and SIN layers.

3. The method as set forth in claim 1, wherein the performing of one or more strip operations comprises performing one or more of a dry strip and a wet strip.

4. The method as set forth in claim 1, wherein the performing of the OP etch comprises etching with a plasma comprising $NF_3/CH_2F_2/N_2$.

5. The method as set forth in claim 1, wherein the trimming of the hard mask layer comprises etching with $CF_4/O_2$ with substantially zero bias power.

6. The method as set forth in claim 1, wherein the performing of the CD trim operation comprises etching with $C_4F_8/O_2/Ar$ with high bias power.

7. The method as set forth in claim 1, wherein:
    the providing of a hard mask layer comprises providing an amorphous carbon layer (ACL); and
    the performing one or more strip operations forms a plurality of pencil-like BL profiles in the OP layers.

8. A semiconductor device manufactured according to the method of claim 1, in which the OP layers comprise a plurality of alternating oxide/polysilicon (OP) layers.

9. A semiconductor device manufactured according to the method of claim 8.

10. A method of forming collapse-free high-aspect-ratio trenches in a semiconductor film stack, the method comprising:
    forming a plurality of layers of polysilicon and/or oxide on a dielectric layer above a substrate, with an oxide layer overlaying the layers of polysilicon and oxide;
    depositing a silicon nitride (SIN) layer on the oxide layer;
    disposing a plurality of layers of material on the SIN layer, the layers of material comprising an amorphous carbon layer (ACL);
    performing an etch to remove a portion of the ACL, a portion of the oxide layer, a portion of the SIN layer and portions of the layers of polysilicon and/or oxide, thereby defining a layout of a plurality of trenches in the semiconductor film stack, wherein performing the etch preferentially removes material in at least one dielectric layer overlaying the ACL, and the etch generating an undercut in an oxide layer disposed beneath the SIN layer; and
    forming one or more pencil-like structures between trenches, the pencil-like structure comprising a tapered oxide layer and a tapered, rounded SIN layer, the pencil-like structure acting to prevent collapse of trenches and facilitating fill-in of the trenches.

11. The method as set forth in claim 10, wherein the forming of a pencil-like structure further prevents bending and bowing of sides of the trenches, thereby preventing formation of voids during fill-in.

12. The method as set forth in claim 10, wherein:
    the performing comprises etching with a plasma comprising $NF_3/CH_2F_2/N_2$; and
    the forming of the pencil-like structure comprises:
        trimming the ACL to expose portions of the SIN layer;
        performing a critical dimension (CD) trim operation whereby sidewalls of the trenches are trimmed and exposed portions of the SIN layer are etched by plasma; and
        performing one or more strip operations to remove polymer residues.

13. The method as set forth in claim 12, wherein:
    the layers of material further comprise a dielectric anti-reflective coating (DARC®), a bottom anti-reflective coating (BARC), and a patterned photoresist (PR); and
    the performing of one or more strip operations comprises performing a dry strip followed by a wet strip.

14. The method as set forth in claim 10, in which the disposing of a plurality of layers of material further comprises disposing a dielectric anti-reflective coating (DARC®), a bottom anti-reflective coating (BARC), and a patterned photoresist (PR).

15. The method as set forth in claim 14, in which the layers comprise a plurality of alternating oxide/polysilicon (OP) layers.

16. The method as set forth in claim 15, in which the performing of an etch entails removal of BARC and DARC®, a portion of the ACL, a portion of the oxide layer, a portion of the SIN layer and portions of the layers of polysilicon and/or oxide whereby the trenches in the semiconductor film stack are formed.

\* \* \* \* \*